United States Patent [19]

Lu et al.

[11] Patent Number: 4,719,124
[45] Date of Patent: Jan. 12, 1988

[54] LOW TEMPERATURE DEPOSITION UTILIZING ORGANOMETALLIC COMPOUNDS

[75] Inventors: Po-Yen Lu, Westfield, N.J.; Chi-Hua Wang, Taiwan, Taiwan; Larry M. Williams, Piscataway, N.J.

[73] Assignee: American Telephone and Telegraph Company AT&T Bell Laboratories, Murray Hill, N.J.

[21] Appl. No.: 851,255

[22] Filed: Jul. 28, 1986

[51] Int. Cl.$^4$ .......................................... H01L 21/365
[52] U.S. Cl. ...................... 437/126; 156/613
[58] Field of Search ........................... 156/613; 427/87

[56] References Cited

U.S. PATENT DOCUMENTS

| 4,116,733 | 9/1978 | Olsen | 156/613 |
| 4,468,283 | 8/1984 | Ahmed | 156/613 |
| 4,566,918 | 1/1986 | Irvine | 427/87 |

FOREIGN PATENT DOCUMENTS 60-215596  10/1985  Japan .................................. 156/613

OTHER PUBLICATIONS

"The Growth of $Cd_xHg_{1-x}Te$ Using Organometallics", by J. B. Mullin and S. J. C. Irvine, *Journal of Vacuum Science and Technology*, vol. 21, No. 1, (May/-Jun. 1982) pp. 178–181.

*Primary Examiner*—John D. Smith
*Attorney, Agent, or Firm*—Bruce S. Schneider

[57] ABSTRACT

It has been found that deposition temperature for materials such as cadmium mercury telluride is significantly lowered by precracking selected precursor materials. For example, if organometallic compounds such as diethylmercury and diethyltellurium are decomposed before introduction in the deposition vapor, epitaxial layer formation is possible at 250° C.

11 Claims, 4 Drawing Figures

LOW TEMPERATURE DEPOSITION UTILIZING ORGANOMETALLIC COMPOUNDS

BACKGROUND OF THE INVENTION

1. Field of the Invention

This invention relates to the deposition of semiconductor materials and, in particular, the deposition of semiconductor materials utilizing organometallic compounds.

2. Art Background

Recently, the use of II-VI semiconductor materials in infrared detection devices, such as devices utilized for observing objects in low light surroundings, has generated substantial interest. Additional interest has been generated by the contemplated use of these material in applications such as detectors and lasers for optical fiber communications.

For any of these uses, the II-VI material must, during the fabrication process, be deposited on a mechanically stable structure, i.e., a substrate. This deposition of semiconductor materials such as II-VI semiconductor materials, e.g., cadmium telluride, mercury telluride, cadmium sulfide, zinc selenide and mercury cadmium telluride, is, in one method, accomplished by a metal-organic chemical vapor deposition procedure (MOCVD). In this procedure a deposition vapor flow containing at least one organometallic compound is established, and deposition is induced by interaction with the heated substrate. For example, cadmium telluride has been deposited by passing a combination of dimethylcadmium and either dimethyltelluride or diethyltelluride over a substrate heated to a temperature typically in the range 340° C. to 420° C. Similarly, various procedures have been developed for the deposition of cadmium mercury telluride utilizing precursors such as elemental mercury, dimethylcadmium, and diethyltelluride.

To fabricate many useful devices, it is necessary to deposit sequentially a multiplicity of compositionally differing layers. In such deposition procedures, the precursor material for depositing the first layer is introduced and after deposition of sufficient material, this precursor is changed to induce the formation of subsequent overlying layers. Frequently, e.g., for mercury entities, interdiffusion occurs between adjacent layers or between the substrate and its overlying layer inducing degradation in device performance.

The use of low temperature deposition prevents interdiffusion and also limits the amount of volatile materials escaping from the layer being deposited. This latter effect is quite significant for deposited layers containing entities such as mercury with high vapor pressures. For such materials, high precursor partial pressures are required to limit the extent of volatilization and thus to limit, in turn, control of device properties. However, use of high precursor concentrations is inconvenient because, for materials such as elemental mercury, the entire gas flow pathway must be heated to prevent condensation of the precursor before it reaches the substrate. Additionally, for materials such as dimethylmercury use of high concentration is not economic.

Various expedients have been utilized in an attempt to lower the deposition temperature and thus lower the extent of interdiffusion and volatilization. For example, the precursor material at the substrate has been irradiated with ultraviolet light, i.e., light of wavelength 194 to 260 nm. Although this procedure has proven useful for depositing II-VI materials at temperatures as low as 200° C., the introduction of light through the deposition apparatus from an external source introduces difficulties. Exemplary of such difficulties is the frequent maintenance required to remove internal deposits of opaque matter from the window utilized to introduce the light. Thus, expedient processes for low temperature deposition of materials, such as II-VI semiconductor materials, are still quite desirable.

SUMMARY OF THE INVENTION

Deposition of materials such as II-VI semiconductor materials (with controlled properties) is achievable at low temperature, e.g., temperatures below 300° C., by the satisfaction of two criteria. In particular, (1) each organometallic precursor that undergoes substantial decomposition only at temperatures above 300° C. should be precracked, i.e., the organometallic compound should be sufficiently decomposed to yield a partial pressure of the metal (or molecular fragment containing the metal) that is greater than or equal to the vapor pressure of that metal in the growing film at the substrate temperature, and (2) the resulting entities that are to be introduced into the deposited layer should be reacted with the remaining reactive precursor substances only at the substrate. For example, in the deposition of cadmium mercury telluride, it is possible to deposit at a temperature in the range 220° C. to 300° C. by precracking diethyltellurium and dimethylmercury. The resulting decomposition products are not contacted with the cadmium precursor, e.g., dimethylcadmium, except on the substrate surface. Premature contact induces disadvantageous powder formation of materials such as cadmium telluride. Despite the relatively long interval between decomposition of the precracked precursors and contact with the remaining precursors at the substrate, deposited layer quality as measured by infrared spectroscopy and Hall mobility is quite good.

DETAILED DESCRIPTION

Figure 1:
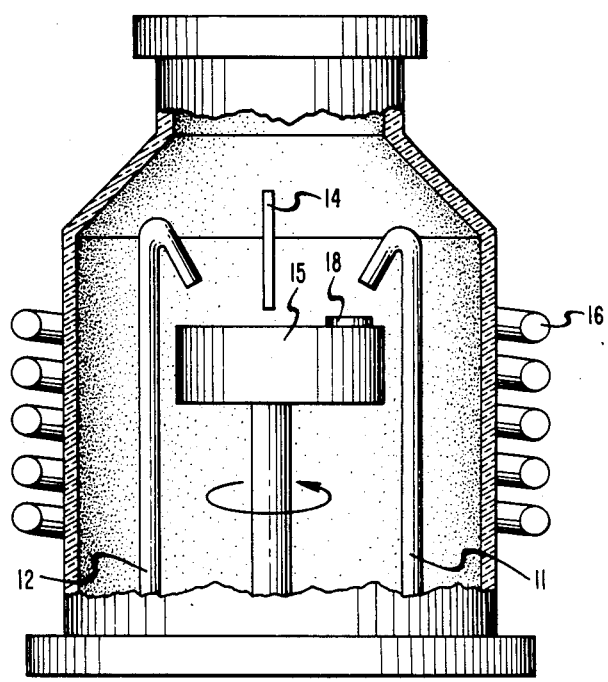
FIG. 1 is illustrative of an apparatus suitable for practices involving the invention.

Deposition is induced by contacting a substrate with a precursor mixture suitable for depositing the desired layer composition. The composition of the substrate is not critical. For example, it is possible to utilize a single crystal substrate, such as a cadmium telluride or gallium arsenide single crystal. (See, for example, J. B. Mullin and S. J. C. Irvine, *Journal of Vacuum Science and Technology*, 21, 178 (1982).) Alternatively, it is possible to include a substrate having various layers such as cadmium telluride layers previously deposited on a single crystal substrate.

The substrate temperature is typically dictated by the materials utilized in the structure to be fabricated and the configuration of that structure. For example, a sufficiently low temperature should be utilized so that substantial interdiffusion of materials between the device layers is substantially avoided. Exemplary of situations where diffusion is not desirable is in devices such as lasers employing adjacent layers of differing mercury concentration, e.g., adjacent layers of $CdTe/Hg_{1-x}Cd_xTe/CdTe$. In such devices, temperatures above 350° C. typically cause significant interdiffusion of mercury and thus, in turn, substantially degrade device performance. Similarly, in devices where mercury compositons such as $Hg_{1-x}Cd_xTe$ are utilized, again temperatures below 350° C. are desirable to prevent the necessity of extremely high precursor gas concentration. Indeed, it is generally desirable for devices relying on II-VI semiconductor materials to deposit at temperatures below 300° C., preferably below 250° C.

To achieve the desired low temperatures and to ensure the attainment of acceptable deposited layer quality, two criteria should be satisfied. To satisfy the first criterion, it is desirable that each organometallic material utilized, which undergoes substantial decomposition only at temperatures above 300° C., should be precracked. To satisfy the second criterion, reactive precursor gases that are not precracked and which ultimately form a substantial portion of the deposited material, i.e., greater than 0.1 mole percent, should be contacted with the precracked materials only on the substrate. (Precracking, in the context of this invention, means decomposing the organometallic compound sufficiently to yield a partial pressure of the metal (or molecular fragment containing the metal) that is greater than or equal to the vapor pressure of that metal in the growing film at the substrate temperature. A reactive precursor, in this context, is one that interacts with a cracking entity to form a non-gaseous product at the operating temperatures.) Combination or reactive and precracked entities at an inappropriate spatial region generally results in the disadvantageous formation of powders in the gas stream. (It is possible to introduce a non-reactive gas precursor either together with the cracked material or with the reactive material on the substrate.) A suitable procedure for ensuring interaction at the substrate is achieved by using a rotating sample holder. The substrate is first rotated to intersect the flow of precracked entities. The substrate is then rotated out of this flow and into a flow of reactive precursor gases.

Precursor gases are chosen so that they supply the appropriate entities for forming the desired device layer. Generally, it is possible to supply both the Group VI and the Group II entities utilizing organometallic compounds. Compounds such as dimethyl or diethylcadmium are useful for the deposition of layers containing cadmium atoms; compounds such as dimethyl or diethyl or diisopropyltelluride are useful for the deposition of layers containing telluride atoms; compounds such as elemental mercury, diethylmercury, and dimethylmercury are useful for the deposition of layers containing mercury atoms; and compounds such as diethylzinc are useful for the deposition of layers containing zinc atoms. For typical deposition, the precursor is employed at a partial pressure in the range 0.001 Torr to approximately 30 Torr. The mole ratios of precursor compound are adjusted to yield the desired deposited layer stoichiometry. Generally, an appropriate mole ratio is determined by employing a control sample.

Cracking is accomplished by a wide variety of expedients. In one exemplary embodiment, the materials to be cracked are flowed through a heated tube, 11 in FIG. 1. The tube is heated to a temperature above the decomposition temperature of the precursor gas and is sufficiently long to ensure that precracking occurs. Typically, for gases such as dimethylmercury and diethyltelluride, temperatures in the range 350° C. to 450° C. are utilized, with heated tube lengths in the range 10 to 20 cm and gas velocities in the range 10 to 100 cm/sec. The precise parameters employed with a given reactor configuration, precursor gas composition, and substrate temperature are easily determined through the use of a controlled sample.

Expedients should be employed to prevent the mixing of the precracked gas with materials that induce powder formation. For example, it is possible to insert a baffle, such as shown in FIG. 1 at 14, between the source of the precracked gas and the source of the reactive material to ensure their combination only at the substrate. The use of this particular embodiment is not critical, and any expedient that prevents premature mixing to form powders is acceptable. Once the II-VI material is deposited, the device is completed by, for example, wellknown techniques.

The following examples are illustrative of the invention:

EXAMPLE I

Film deposition was carried out in a vertical cold wall MOCVD reactor (FIG. 1) containing a rotating graphite susceptor (silicon carbide coated), 15, heated with an rf induction coil, 16. The current setting for the rf power supply was fixed throughout each run; this current was used to obtain the desired substrate temperature. The deposition temperature was monitored by an infrared pyrometer and was monitored at approximately 250° C. The reactor pressure was maintained at 600 Torr by a pressure controller and a mechanical vacuum pump.

To avoid CdTe powder formation, the feed gases entered the reactor through two separate 6 mm diameter quartz tubes, 11 and 12. Dimethylmercury and diethyltelluride were flowed from one heated tube, 11, while dimethylcadmium was flowed from the other tube, 12. To further ensure avoidance of powder formation, a baffle, 14, was placed between the two quartz tubes. The tube with flowing dimethylmercury and diethyltelluride was wrapped with a resistance wire for a distance of 15 centimeters. The energy for precracking the metalorganics was provided by the resistance wire and was controlled by regulating the current through the wire using a direct current power supply. The power input to the wire was about 100 watts.

Dimethylmercury and dimethylcadmium bubblers were maintained at 0° C. and a diethyltelluride bubbler was maintained at 25° C. in constant temperature baths. These metalorganics were delivered to the reactor using hydrogen as a carrier gas. Typical flow rates of hydrogen through the dimethylmercury, dimethylcadmium and the diethyltelluride bubblers were kept at 25 sccm, 0.6 sccm and 4.8 sccm, respectively, by mass flow controllers. The metalorganic sources were further diluted about ten times by hydrogen gas.

Semi-insulating (100) cadmium telluride substrates were cleaned by boiling in chloroform and acetone, rinsed in methanol, and then etched with a dilute bromine-methanol solution. The etched substrates were further rinsed with methanol and then blown dry with nitrogen. The substrate, 18, was then placed off-center on the susceptor, 15. The reactor was then sealed and evacuated to a pressure of approximately 10 mTorr. A hydrogen flow was initiated and the pumping speed was reduced to bring the reactor up to operating pressure. Only hydrogen was allowed to flow into the reactor while power was applied to the precracking tube, and while the substrate was allowed to stabilize at the desired growth temperature. The metalorganic flows were begun to initiate growth. During the growth, as the susceptor was rotated, the substrate alternately passed under (1) the heated tube carrying the pre-cracked products of dimethylmercury and diethyltelluride and, (2) the tube carrying dimethylcadmium. (Typical susceptor rotation speed was 100 rpm.) A layer thickness of 4 μm was achieved after three hours. The flows were then terminated and the chamber evacuated. (Growth rates of between 1 to 2 μm/hr. were observed.)

Figure 2:
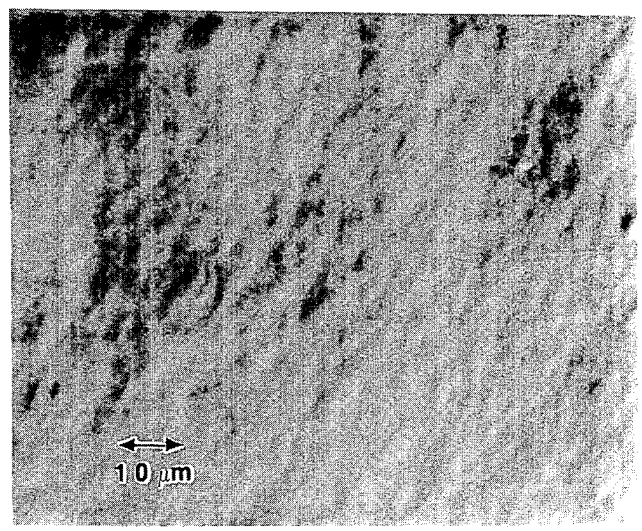
FIGS. 2-4 are illustrative of results achieved with the invention.
Figure 3:
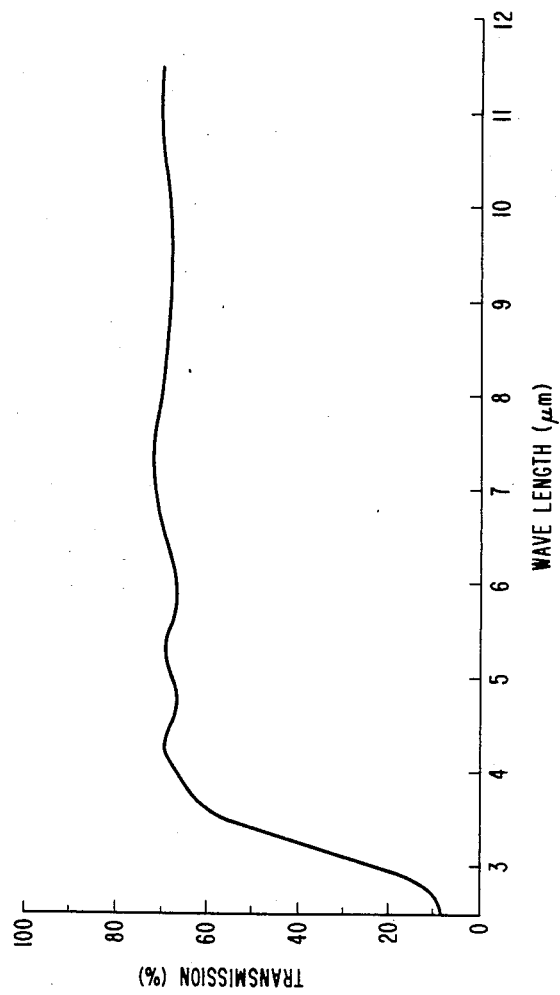

Typical morphology of the resulting $Hg_{0.7}Cd_{0.3}Te$ film is shown in FIG. 2. The surface was specular and has features similar to that of the substrate. The IR transmission spectra of these films is shown in FIG. 3. As indicated in FIG. 3, the IR transmission has very sharp cut-off edges. (The measured films had thicknesses of about 4.0 μm.) The material was n-type material with a room temperature Hall mobility of 12,200 $cm^2$/V-sec and a carrier concentration of $2.7 \times 10^{17}/cm^3$. (A Hall mobility of 27,000 $cm^2$/V-sec was obtained for a carrier concentration of $1.0 \times 10^{17}/cm^3$ at 77° K.)

EXAMPLE II

Figure 4:
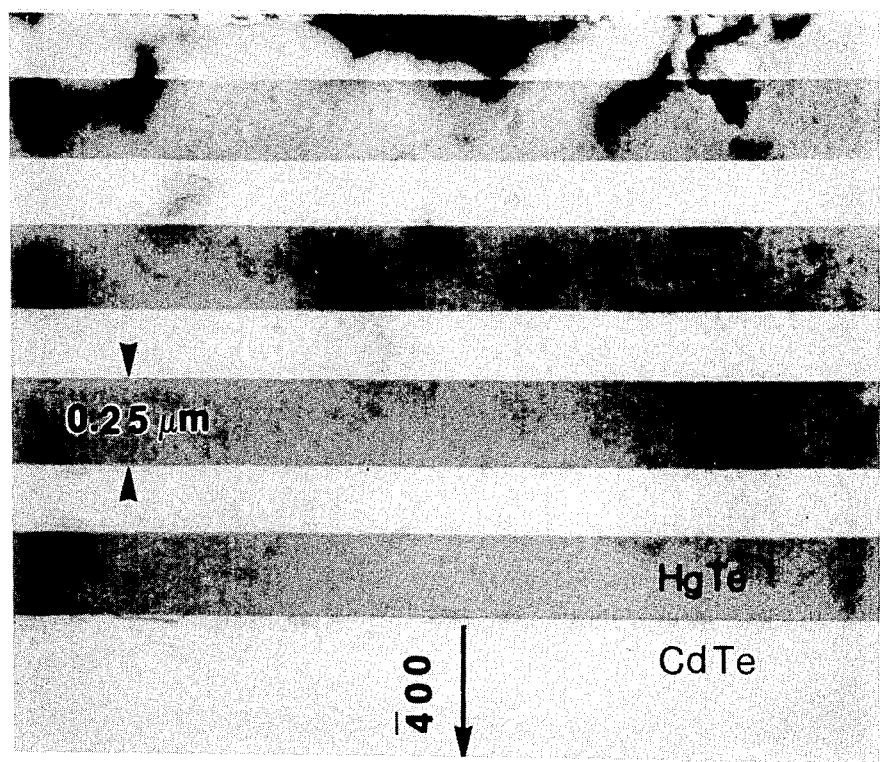

For growing multilayer structures, the procedure of Example I was followed. However, for the HgTe growth, a gas flow of dimethylmercury and diethyltelluride was introduced into the heated tube. For the CdTe growth, diethyltelluride was introduced into the heated tube while a gas flow of dimethylcadmium was introduced into the other tube. During the HgTe growth, the flow was established by utilizing 26 and 5 sccm hydrogen flows through dimethylmercury and diethyltelluride bubblers, respectively. During the CdTe growth, a hydrogen flow of 4 and 2 sccm through dimethylcadmium and diethyltelluride bubblers, respectively, was employed. Growth of each layer lasted 15 minutes. This procedure yielded HgTe/CdTe heterojunctions. A typical cross-section transmission electron micrograph of these heterojunctions (FIG. 4) shows an extremely sharp boundary.

What is claimed is:

1. A process for forming a device comprising the steps of (1) subjecting a heated substrate to at least two precursor gases whereby the deposition of a II-VI semiconductor material on said substrate is induced, and (2) completing said device CHARACTERIZED IN THAT at least one of said precursor gases substantially decomposes only at temperatures above 300° C. and each of said precursor gases that substantially decomposes only at temperatures above 300° C. is precracked.

2. The process of claim 1 wherein said II-VI material comprises cadmium telluride.

3. The process of claim 1 wherein said II-VI material comprises cadmium mercury telluride.

4. The process of claim 1 wherein said substrate is heated to a temperature below 300° C.

5. The process of claim 4 wherein said substrate is heated to a temperature below 250° C.

6. The process of claim 4 wherein an entity from said precracked precursor is reacted with a second of said precursor gases at the substrate.

7. The process of claim 1 wherein an entity from said precracked precursor is reacted with a second of said precursor gases at said substrate.

8. The process of claim 7 wherein said precursor that is precracked comprises dimethylmercury.

9. The process of claim 8 wherein said second precursor comprises dimethylcadmium.

10. The process of claim 1 wherein said precursor that is precracked is dimethylmercury.

11. The process of claim 1 wherein said precursor that is precracked is diethyltelluride.

* * * * *

UNITED STATES PATENT AND TRADEMARK OFFICE
CERTIFICATE OF CORRECTION

PATENT NO. : 4,719,124

DATED : January 12, 1988

INVENTOR(S) : Po-Yen Lu, Chi-Hua Wang, Larry M. Williams

It is certified that error appears in the above-identified patent and that said Letters Patent is hereby corrected as shown below:

Column 3, line 49, "telluride" should read --tellurium--.

Signed and Sealed this

Sixteenth Day of May, 1989

Attest:

DONALD J. QUIGG

Attesting Officer

Commissioner of Patents and Trademarks